(12) United States Patent
Imamura et al.

(10) Patent No.: US 7,294,532 B2
(45) Date of Patent: Nov. 13, 2007

(54) METHOD FOR MANUFACTURING SEMICONDUCTOR DEVICE

(75) Inventors: Hiroyuki Imamura, Settsu (JP); Nobuyuki Koutani, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 71 days.

(21) Appl. No.: 11/146,610

(22) Filed: Jun. 7, 2005

(65) Prior Publication Data

US 2005/0218485 A1 Oct. 6, 2005

Related U.S. Application Data

(62) Division of application No. 10/833,972, filed on Apr. 27, 2004.

(30) Foreign Application Priority Data

Apr. 28, 2003 (JP) ............................. 2003-124281

(51) Int. Cl.
*H01L 21/44* (2006.01)

(52) U.S. Cl. ...................... 438/108; 438/118; 438/119; 438/E21.503

(58) Field of Classification Search ................ 438/108, 438/118–119; 257/778–783
See application file for complete search history.

(56) References Cited

U.S. PATENT DOCUMENTS

| 5,477,087 | A |   | 12/1995 | Kawakita et al. |         |
|-----------|---|---|---------|-----------------|---------|
| 5,604,156 | A |   | 2/1997  | Chung et al.    |         |
| 5,660,177 | A | * | 8/1997  | Faupel et al.   | 600/382 |
| 5,844,320 | A | * | 12/1998 | Ono et al.      | 257/778 |
| 5,982,629 | A | * | 11/1999 | Shoji et al.    | 361/760 |
| 6,042,999 | A |   | 3/2000  | Lin et al.      |         |
| 6,043,429 | A |   | 3/2000  | Blish et al.    |         |
| 6,133,534 | A |   | 10/2000 | Fukutomi et al. |         |

(Continued)

FOREIGN PATENT DOCUMENTS

EP    1 215 719 A    6/2002

(Continued)

OTHER PUBLICATIONS

Taiwanese Office Action from corresponding Taiwanese application 094109385, mailed Apr. 17, 2007.

*Primary Examiner*—Dung A. Le
(74) *Attorney, Agent, or Firm*—Hamre, Schumann, Mueller & Larson, P.C.

(57) ABSTRACT

A method for manufacturing a semiconductor device that includes mounting a semiconductor chip on a circuit board having an insulating substrate, a plurality of wiring layers arranged on the insulating substrate, and bumps formed on the wiring layers respectively, in which the bump is provided across a longitudinal direction of a corresponding one of the wiring layers so as to extend over regions on both sides of the wiring layer and contact a surface of the insulating substrate, without a stepped portion formed on a surface of the bump, and a cross sectional shape of the bump taken in a width direction of the wiring layer is such that a central portion is higher than both side portions. The method also includes connecting electrode pads of the semiconductor chip to the bumps, thereby achieving connection between the electrode pads of the semiconductor chip and the wiring layers via the bumps.

14 Claims, 8 Drawing Sheets

U.S. PATENT DOCUMENTS

| | | |
|---|---|---|
| 6,137,184 A | 10/2000 | Ikegami |
| 6,223,429 B1 | 5/2001 | Kaneda et al. |
| 6,568,073 B1 | 5/2003 | Fukutomi et al. |
| 6,730,858 B2 * | 5/2004 | Gotoh et al. ............... 174/260 |
| 6,918,529 B2 | 7/2005 | Tsukaguchi et al. |

FOREIGN PATENT DOCUMENTS

| | | |
|---|---|---|
| JP | 59-130434 | 7/1984 |
| JP | 63-160350 | 7/1988 |
| JP | 63-193536 | 8/1988 |
| JP | 5-206204 | 8/1993 |
| JP | 5-243332 | 9/1993 |
| JP | 6-5778 | 1/1994 |
| JP | 8-97301 | 4/1996 |
| JP | 8-172242 | 7/1996 |
| JP | 9-82747 | 3/1997 |
| JP | 10-233571 | 9/1998 |
| JP | 2001-168129 | 6/2001 |
| TW | 485515 B | 5/2002 |
| TW | 492051 B | 6/2002 |

* cited by examiner

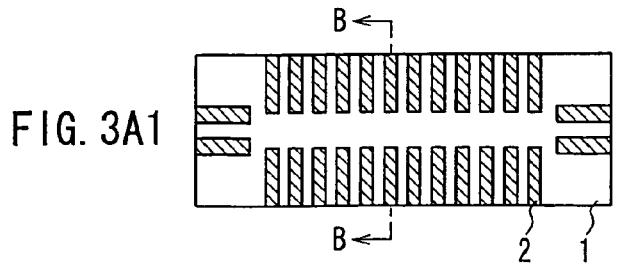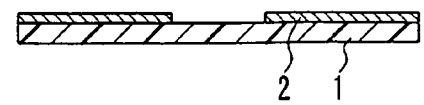
FIG. 3A1　　　　　　　　　FIG. 3A2
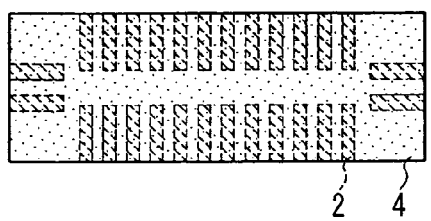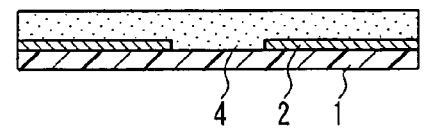
FIG. 3B1　　　　　　　　　FIG. 3B2
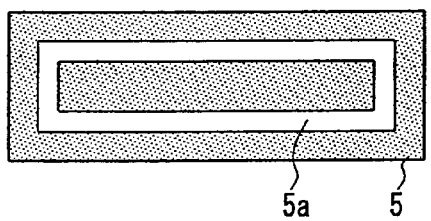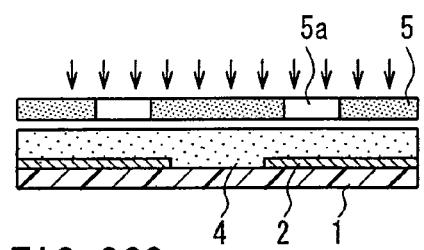
FIG. 3C1　　　　　　　　　FIG. 3C2
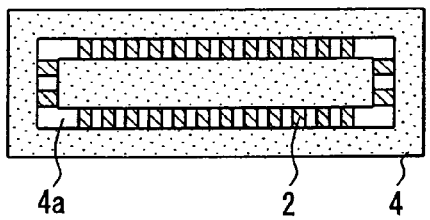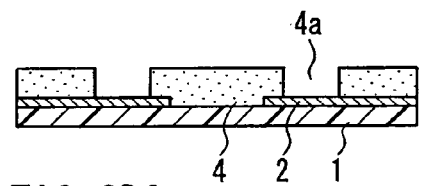
FIG. 3D1　　　　　　　　　FIG. 3D2
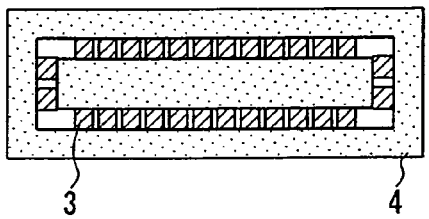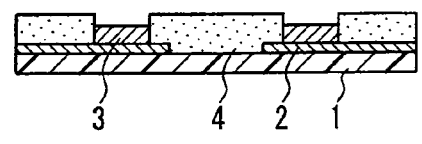
FIG. 3E1　　　　　　　　　FIG. 3E2
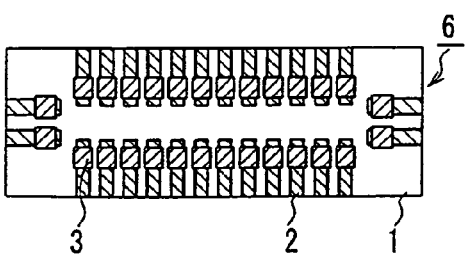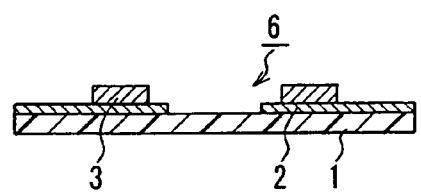
FIG. 3F1　　　　　　　　　FIG. 3F2

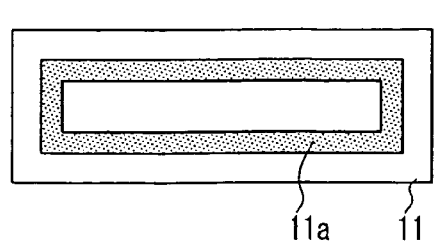
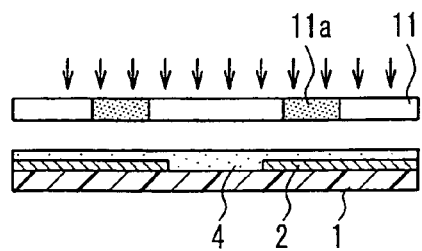
FIG. 10A  FIG. 10B
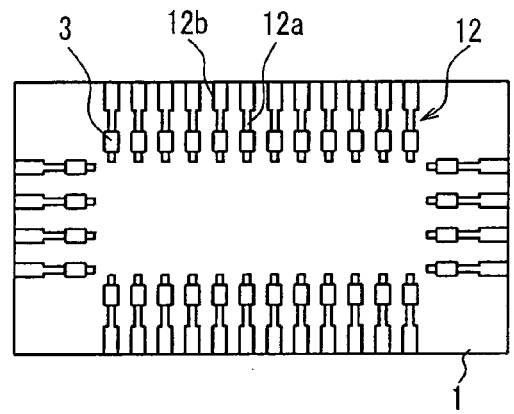
FIG. 11
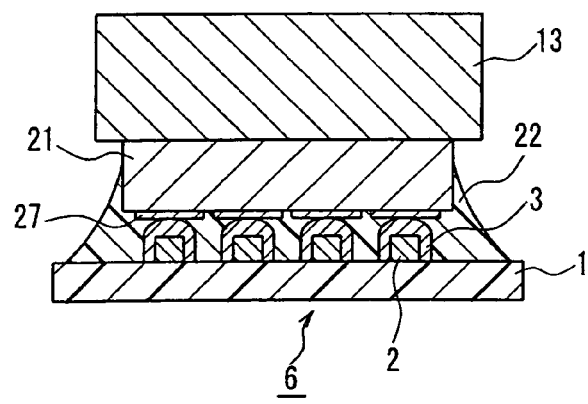
FIG. 12

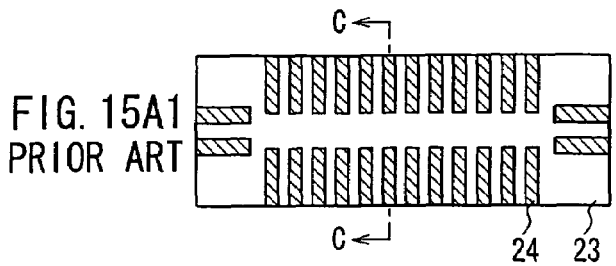
FIG. 15A1
PRIOR ART
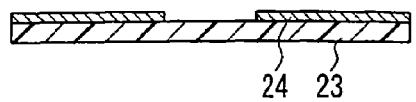
FIG. 15A2
PRIOR ART
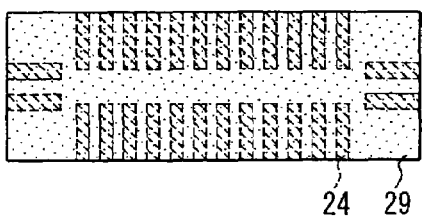
FIG. 15B1
PRIOR ART
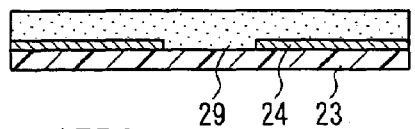
FIG. 15B2
PRIOR ART
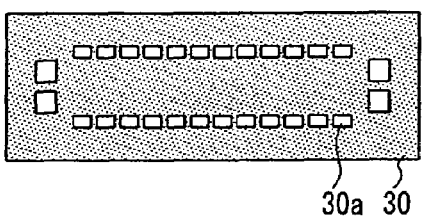
FIG. 15C1
PRIOR ART
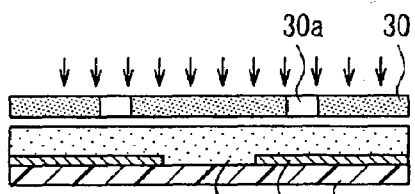
FIG. 15C2
PRIOR ART
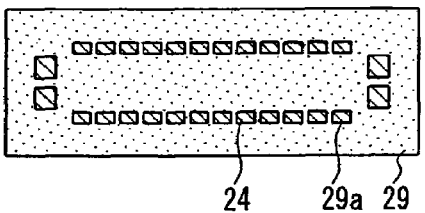
FIG. 15D1
PRIOR ART
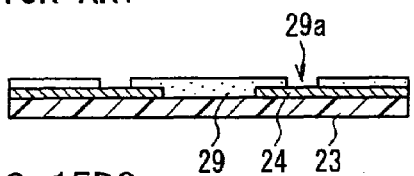
FIG. 15D2
PRIOR ART
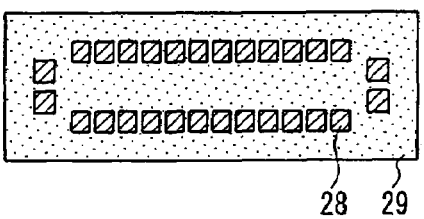
FIG. 15E1
PRIOR ART
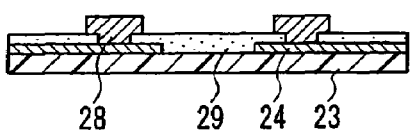
FIG. 15E2
PRIOR ART
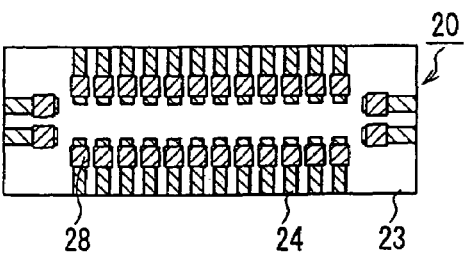
FIG. 15F1
PRIOR ART
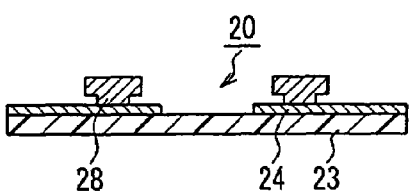
FIG. 15F2
PRIOR ART

METHOD FOR MANUFACTURING SEMICONDUCTOR DEVICE

This application is a Division of application Ser. No. 10/833,972, filed Apr. 27, 2004, which application is incorporated herein by reference.

FIELD OF THE INVENTION

The present invention relates generally to a circuit board such as a tape carrier substrate used in a chip-on-film (COF) package module. In particular, the present invention relates to a configuration of bumps formed on wiring layers on the circuit board and a method for manufacturing the circuit board.

BACKGROUND OF THE INVENTION

As one type of package module using a film substrate, the one employing a COF structure has been known. FIG. 14 is a cross-sectional view showing a part of one example of a package module with a COF structure. The COF package module includes a semiconductor chip 21 mounted on an insulating flexible tape carrier substrate 20 and is protected by an encapsulation resin 22. Such a COF package module mainly is used as a driver for operating a flat panel display. The tape carrier substrate 20 includes as main components an insulating film substrate 23 and wiring layers 24 formed on a surface of the film substrate 23. A metal coating 25 formed by plating and a layer of a solder resist 26 as an insulating resin are formed on the wiring layers 24, if necessary. In general, polyimide is used as a material of the film substrate 23 and copper is used as a material of the wiring layers 24.

The wiring layers 24 formed on the tape carrier substrate 20 and electrode pads 27 formed on the semiconductor chip 21 are connected to each other via bumps 28. The bumps 28 are provided either by previously forming them on the wiring layers 24 on the tape carrier substrate 20 or by previously forming them on the electrode pads 27 on the semiconductor chip 21.

When forming the bumps 28 on the wiring layers 24 on the tape carrier substrate 20, a method as disclosed in JP 2001-168129 A is used, for example. Major aspects of this method will be described with reference to FIGS. 15A1 to 15F1 and FIGS. 15A2 to 15F2. FIGS. 15A1 to 15F1 are plan views showing a part of the film substrate in a series of processes in the conventional method. FIGS. 15A2 to 15F2 are cross-sectional views of FIGS. 15A1 to 15F1, respectively. Each of the cross-sectional views is taken along the line C-C in FIG. 15A1. These processes are directed to an example where the bumps are formed by metal plating.

First, on the film substrate 23 on which the wiring layers 24 are formed as shown in FIG. 15A1, a photoresist 29 is formed so as to cover the entire surface of the film substrate 23 as shown in FIG. 15B1. Next, as shown in FIG. 15C1, using an exposure mask 30 for forming the bumps, the photoresist 29 is exposed to light through light-transmitting regions 30a of the exposure mask 30. Subsequently, as shown in FIG. 15D1, the photoresist 29 is developed to form opening patterns 29a. Thereafter, as shown in FIG. 15E1, a metal is plated on the wiring layers 24 through these opening patterns 29a. By removing the photoresist 29, the tape carrier substrate 20 provided with the wiring layers 24 on which the bumps 28 are formed is obtained as shown in FIG. 15F1. In general, the bumps 28 are arranged along four sides of the rectangular film substrate 23 as shown in FIG. 15F1.

However, instead of a single row arrangement along each side of the film substrate 23 as shown in FIG. 15F1, the bumps 28 may be arranged in a plurality of rows along each side of the film substrate 23.

When forming the bumps 28 on the wiring layers 24 formed on the tape carrier substrate 20 in the above-described manner, accurate positioning of the exposure mask 30 is difficult owing to the characteristics of the film substrate 23. If the exposure mask 30 is not placed in proper position, favorable bumps 28 cannot be formed. On this account, the bumps 28 generally are formed on the electrode pads 27 on the semiconductor chip 21. On the other hand, forming the bumps 28 on the wiring layers 24 on the tape carrier substrate 20 is advantageous in that it requires a smaller number of processes than forming the bumps 28 on the electrode pads 27 on the semiconductor chip 21 and thus can reduce manufacturing cost.

However, the bumps 28 formed by the above-described conventional method have a problem in that the shape thereof is not favorable. FIGS. 16A and 16B are cross-sectional views of the tape carrier substrate obtained through the processes described above. FIG. 16A is a cross-sectional view taken in the longitudinal direction of the wiring layers 24, which is the same cross-sectional view as FIG. 15F2. On the other hand, FIG. 16B is a cross-sectional view taken along the line D-D in FIG. 16A, i.e., taken in the transverse direction of the wiring layers 24.

As shown in FIGS. 16A and 16B, each of the bumps 28 is formed to be joined to an upper surface of the corresponding wiring layer 24. Thus, the bump 28 is held on the wiring layer 24 only by joining a portion with an extremely small area to the upper surface of the wiring layer 24. Accordingly, when the bump 28 receives a force in the lateral direction, it is liable to come off from the upper surface of the wiring layer 24. For example, when a force in the lateral direction is applied between the semiconductor chip 21 and the tape carrier substrate 20 when the bumps 28 are joined to the electrode pads 27 (see FIG. 14) on the semiconductor chip 21, there is a risk that the bumps 28 might come off from the wiring layers 24, which renders the connection after the semiconductor chip is mounted unstable.

Furthermore, the bumps 28 have flat upper surfaces because they are formed only on the upper surfaces of the wiring layers 24 by carrying out plating through the minute opening patterns 29a shown in FIG. 15D1. The flat upper surfaces of the bumps 28 may bring about the following problems when connecting the bumps 28 to the electrode pads 27 on the semiconductor chip 21.

First, if there is a displacement in positioning between the bumps 28 and the electrode pads 27, each of the bumps 28 with the flat upper surfaces is prone to be in contact with the electrode pad 27 that is adjacent to the electrode pad 27 to which the bump 28 actually is to be connected. This brings about the risk that the bumps 28 might be connected to incorrect electrode pads 27.

Second, when connecting the bumps 28 to the electrode pads 27, it is difficult to break natural oxide films formed on the surfaces of the electrode pads 27. Usually, the oxide films formed on the electrode pads 27 are broken by the contact of the bumps 28 against the electrode pads 27 so that the bumps 28 are electrically connected to metal portions of the electrode pads 27 that are not oxidized. However, with the flat upper surfaces of the bumps 28, it is difficult to break the oxide films.

Thirdly, it is difficult to connect the bumps 28 to the electrode pads 27 in the state where the resin layer 22 intervenes between the semiconductor chip 21 and the tape carrier substrate 20 as shown in FIG. 17. When mounting the semiconductor chip 21 on the tape carrier substrate 20, the bumps 28 are brought into contact with the respective electrode pads 27 by displacing the resin layer 22 with their heads. However, the bumps 28 with the flat upper surfaces cannot displace the resin layer 22 sufficiently.

Moreover, when forming the bumps 28 by the conventional method illustrated in FIGS. 15A1 to 15F1 and FIGS. 15A2 to 15F2, if the positioning accuracy of the exposure mask 30 for forming the bumps relative to the wiring layers 24 is not sufficient, an area of the portions where the opening patterns 29a overlap with the respective wiring layers 24 becomes smaller. As a result, as shown in FIG. 18, the bumps 28 formed on the respective wiring layers 24 cannot attain the designed size. The problem of such defect in size of the bumps 28 will become more serious as the pitch of the electrode pads 27 becomes narrower in accordance with the demand for higher output power from COF package modules.

Although the above-describe problems are particularly noticeable when using tape carrier substrates, these problems are common to similar kinds of circuit boards.

SUMMARY OF THE INVENTION

Therefore, with the foregoing in mind, it is an object of the present invention to provide a circuit board that allows bumps formed on respective wiring layers to be held with strength sufficient for practical use against the force applied in the lateral direction, thereby achieving sufficient connection stability after a semiconductor chip is mounted thereon.

Furthermore, it is another object of the present invention to provide a circuit board that is provided with bumps having a shape suitable for connection with electrode pads of a semiconductor chip.

Furthermore, it is still another object of the present invention to provide a method for manufacturing a circuit board, capable of allowing the above-described favorable bumps to be formed easily and also allowing the bumps having a sufficient area to be formed reliably on the respective wiring layers even when the positioning accuracy of an opening pattern formed on a photoresist relative to the wiring layers is low.

A circuit board according to the present invention includes: an insulating substrate; a plurality of wiring layers arranged on the insulating substrate; and bumps formed on the wiring layers, respectively. The bump is provided across a longitudinal direction of a corresponding one of the wiring layers so as to extend over regions on both sides of the wiring layer above the insulating substrate, and a cross sectional shape of the bump taken in a width direction of the wiring layer is such that a central portion is higher than portions on both sides of the central portion.

Furthermore, a circuit board according to another aspect of the present invention includes: an insulating substrate; a plurality of wiring layers arranged on the insulating substrate; and bumps formed on the wiring layers, respectively, wherein the bump is provided across a longitudinal direction of a corresponding one of the wiring layers so as to extend over regions on both sides of the wiring layer above the insulating substrate, and an upper surface of the bump is flat.

Furthermore, the present invention provides a method for manufacturing a circuit board, including: arranging a plurality of wiring layers on an insulating substrate; forming a photoresist on a surface of the insulating substrate on which the plurality of wiring layers are provided; forming an opening on the photoresist so that each of the wiring layers is partially exposed in the opening, the opening being provided across the wiring layers so as to extend over regions on both sides of the wiring layers; and plating a metal on the exposed portions of the wiring layers through the opening of the photoresist, thereby forming bumps on the wiring layers, respectively.

These and other advantages of the present invention will become apparent to those skilled in the art upon reading and understanding the following detailed description with reference to the accompanying figures.

BRIEF DESCRIPTION OF THE DRAWINGS

FIGS. 3A1 to 3F1 are plan views showing a part of a film substrate in a series of major processes in a method of manufacturing a tape carrier substrate according to Embodiment 2, and FIGS. 3A2 to 3F2 are enlarged cross-sectional views of FIGS. 3A1 to 3F1, respectively.

FIG. 10A is a plan view illustrating an exposing process using an exposure mask according to another example of Embodiment 2, and FIG. 10B is an enlarged cross-sectional view of the same.

FIG. 11 is a plan view showing a tape carrier substrate according to Embodiment 3.

FIG. 12 is a cross-sectional view showing a semiconductor device according to Embodiment 4.

FIGS. 15A1 to 15F1 are plan views showing a part of a film substrate in a series of major processes in a conventional method of manufacturing a tape carrier substrate, and FIGS. 15A2 to 15F2 are cross-sectional views of FIGS. 15A1 to 15F1, respectively.

DESCRIPTION OF THE PREFERRED EMBODIMENTS

Figure 1:
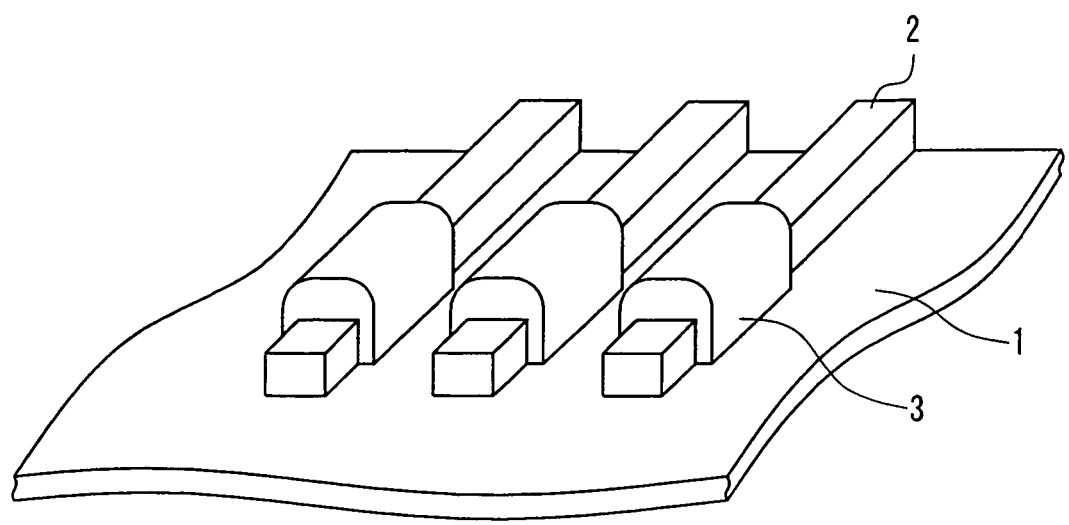
FIG. 1 is a perspective view showing a part of a tape carrier substrate according to Embodiment 1.

In the circuit board according to the present invention, the bump is provided across a longitudinal direction of a corresponding one of the wiring layers so as to extend over regions on both sides of the wiring layer above the insulating substrate. With this configuration, each of the bumps is joined not only to the upper surface but also to both the side surfaces of the corresponding wiring layer, which allows the bump to exhibit sufficient stability against the force applied in the lateral direction.

Preferably, the bump is in contact with a surface of the insulating substrate on both the sides of the wiring layer. Still further, it is preferable that a cross sectional shape of the bump taken in a longitudinal direction of the wiring layer is substantially rectangular. Still further, it is preferable that the wiring layers and the bumps are plated with a metal that is different from materials of the wiring layers and the bumps. Still further, it is preferable that the bump extends across the wiring layer in a direction perpendicular to the longitudinal direction of the wiring layer. Still further, it is preferable that each of the wiring layers has a region narrower than a remaining region at a leading end portion, and the bump is formed in the narrower region.

In the method for manufacturing a circuit board according to the present invention, a photoresist is formed on an entire surface of an insulating substrate on which a plurality of wiring layers are arranged, and then, an opening is formed on the photoresist so as to be a slit-shaped pattern that is provided across the wiring layers so that the regions on both sides of the wiring layers are exposed in the opening. A metal is plated on portions of the wiring layers exposed in the slit-shaped pattern to form bumps on the respective wiring layers.

According to this method, the above-described favorable bumps can be formed easily, and besides, the bumps having a sufficient area can be formed reliably on the respective wiring layers even when the positioning accuracy of the opening pattern formed on the photoresist relative to the wiring layers is low.

In the above-described method of the present invention, the opening may be formed so as to extend across the plurality of wiring layers. Furthermore, in the step of forming the opening on the photoresist, the photoresist is exposed to light using either an exposure mask having a light-transmitting region including a portion that extends in a direction along which the plurality of wiring layers are arranged or an exposure mask having a light-shielding region including a portion that extends in a direction along which the plurality of wiring layers are arranged. Furthermore, it is preferable that a longitudinal direction of the light-transmitting region of the exposure mask or the light-shielding region of the exposure mask is orthogonal to a longitudinal direction of the wiring layers. Preferably, the plating is electroplating.

In the above-described method of the present invention, it is preferable that the wiring layers arranged along a shorter side direction of a semiconductor-chip mounting portion are wider than the wiring layers arranged along a longer side direction of the semiconductor-chip mounting portion, and the opening formed on the photoresist is formed so as to have a continuous shape in a portion along a longer side of the semiconductor-chip mounting portion and a discrete shape including separate openings in a portion along a shorter side of the semiconductor-chip mounting portion. With this configuration, the positional relationship between the bumps formed on the wiring layers arranged along the shorter side direction of the semiconductor-chip mounting portion and the bumps formed on the wiring layers arranged along the longer side direction of the semiconductor-chip mounting portion can be kept constant even when the positioning accuracy of the exposure mask is low.

Furthermore, it is preferable that each of the wiring layers has a region narrower than a remaining region at a leading end portion, and the bump is formed in the narrower region.

It is possible to provide a semiconductor device including a circuit board having any one of the above-mentioned configurations and a semiconductor chip mounted on the circuit board, wherein electrode pads of the semiconductor chip are connected to the wiring layers via the bumps, respectively. Each of the electrode pads of the semiconductor chip may be configured so that an insulating film formed on a surface of the semiconductor chip is located at a perforated bottom of the electrode pad.

A semiconductor device can be manufactured by: mounting a semiconductor chip on a circuit board having any one of the above-mentioned configurations; and connecting electrode pads of the semiconductor chip to the bumps, thereby achieving connection between the electrode pads of the semiconductor chip and the wiring layers via the bumps. In this case, it is preferable that, when connecting the bump to the electrode pad, an oxide film formed on the electrode pad of the semiconductor chip is broken with the bump, thereby achieving electrical connection between the bump and an inner portion of the electrode pad that is not oxidized. Furthermore, it is preferable that a region of the wiring layers on which the bumps are formed is provided with an encapsulation resin, and thereafter, the semiconductor chip is mounted on the circuit board and the electrode pads of the semiconductor chip are connected to the bumps. Furthermore, when the electrode pads of the semiconductor chip are connected to the bumps, ultrasonic energy preferably is applied to portions where the electrode pads are in contact with the bumps while pressing the electrode pads and the bumps against each other.

Hereinafter, embodiments of the present invention will be described specifically with reference to the accompanying drawings. While the embodiments described below are directed to examples where a tape carrier substrate is used, the technical idea of each embodiment also is applicable when other circuit boards are used.

Embodiment 1

Figure 2A:
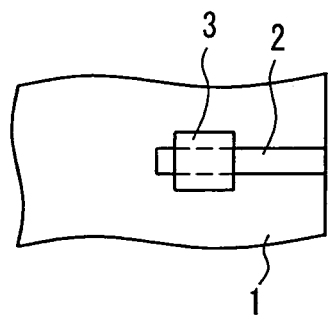
FIG. 2A is a plan view showing another part of the tape carrier substrate shown in FIG. 1.
Figure 2B:
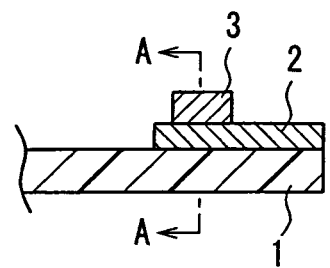
FIG. 2B is a cross-sectional front view of the same.
Figure 2C:
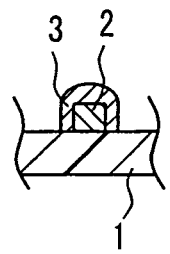
FIG. 2C is a cross-sectional view taken along the line A-A in FIG. 2B.

The configuration of a tape carrier substrate according to Embodiment 1 of the present invention will be described with reference to FIG. 1 and FIGS. 2A to 2C. FIG. 1 is a perspective view showing a part of the tape carrier substrate. FIG. 2A is a plan view showing a part of the tape carrier, FIG. 2B is a cross-sectional front view of the same, and FIG. 2C is a cross-sectional view taken along the line A-A in FIG. 2B.

As shown in FIG. 1, a plurality of wiring layers 2 are arranged in order on a film substrate 1, and a bump is formed on each wiring layer 2. As shown in FIG. 2A, the planer shape of the bump 3 is such that the bump 3 extends across the wiring layer 2 over regions on both sides of the wiring layer 2. On the other hand, the cross sectional shape of the bump 3 taken in the width direction of the wiring layer 2 is such that the bump 3 is joined to an upper surface and both side surfaces of the wiring layer 2 and a central portion is higher than portions on both sides of the central portion, as shown in FIG. 2C. The bump 3 is in contact with the film substrate 1 on both the sides of the wiring layer 2. The cross sectional shape of the bump 3 taken in the longitudinal direction of the wiring layer 2 is substantially rectangular, as shown in FIG. 2B.

By forming the bump 3 in the above-described shape, the bump 3 can be held on the wiring layer 2 with strength sufficient for practical use. That is, since the bump 3 is joined not only to the upper surface but also to both the side surfaces of the wiring layer 2, the bump 3 exhibits sufficient stability against the force applied in the lateral direction.

Moreover, since the bump 3 has an upper surface with the protruding central portion instead of the flat upper surface, the bump 3 is suitable for connection to an electrode pad of a semiconductor chip. First, even if there is a displacement in positioning between the bump 3 and the electrode pad, the bump 3 is less prone to be in contact with an incorrect electrode pad adjacent to the electrode pad to which the bump actually is to be connected, as compared with the case where the bump 3 has a flat upper surface. Second, when connecting the bump 3 to the electrode pad, an oxide film formed on the electrode pad can be broken easily with the upper surface of the bump 3 having the protruding central portion, thereby achieving favorable electrical connection to an inner portion of the electrode pad that is not oxidized. Thirdly, when connecting the bump 3 to the electrode pad in the state where a resin layer intervenes between the semiconductor chip and the tape carrier substrate, the resin layer can be displaced easily with the head of the bump 3.

It is not necessary to form the bump 3 so as to be in contact with the film substrate 1 on both the sides of the wiring layer 2 in order to obtain the above-described effects. However, the bump 3 with such a configuration can be held on the wiring layer 2 most stably against the force applied in the lateral direction. Also, it is not necessary that the cross sectional shape of the bump 3 taken in the longitudinal direction of the wiring layer 2 is substantially rectangular. However, according to such a configuration, the bump 3 is connected to the electrode pad of the semiconductor chip most favorably and besides, the bump 3 can be produced easily.

As shown in FIG. 2C, the thickness of the bump 3 as measured from the upper surface of the wiring layer 2 is greater than the thickness of the bump 3 as measured from each side surface of the wiring layer 2 in the transverse direction. Although forming the bump 3 in this shape is not necessary, such a configuration is effective in suppressing the occurrence of a short circuit between the wiring layer 2 and the semiconductor chip due to curling or the like of the tape carrier substrate and also in avoiding the occurrence of a short circuit with a bump 3 formed on a wiring layer 2 adjacent thereto. The bump 3 can be formed into this shape by the method including a plating process as described later.

As a material of the film substrate 1, polyimide, which is a generally used material, can be used. An insulating film made of PET, PEI, or the like also may be used as the film substrate 1, depending on other conditions. Generally, the wiring layers 2 are formed using copper so as to have a thickness in the range from 3 to 20 µm. If necessary, an epoxy adhesive may intervene between the film substrate 1 and the wiring layers 2.

The thickness of the bumps 3 generally is in the range from 3 to 20 µm. As a material of the bumps 3, copper can be used, for example. When the bumps 3 are formed using copper, it is preferable that the bumps 3 and the wiring layers 2 are plated with a metal. For example, the bumps 3 and the wiring layers 2 may be plated with nickel to form a nickel inner layer and then plated with gold to form a gold outer layer. Alternatively, the bumps 3 and the wiring layers 2 may be plated with tin, (nickel+palladium), only nickel, or only gold. When the bumps 3 and the wiring layers 2 are plated with a metal, no plated metal layer is provided between the bumps 3 and the wiring layers 2. On the other hand, when the bumps 3 are not plated with a metal, gold or nickel is used as a material of the bumps 3 and a plated nickel layer is provided between the bumps 3 and the wiring layers 2.

Embodiment 2

A method for manufacturing a tape carrier substrate according to Embodiment 2 of the present invention will be described with reference to FIGS. 3A1 to 3F1 and FIGS. 3A2 to 3F2. FIGS. 3A1 to 3F1 illustrate a series of major processes of forming bumps on a tape carrier substrate, and each shows a plan view of a region for mounting a semiconductor chip on a film substrate. FIGS. 3A2 to 3F2 are enlarged cross-sectional views of FIGS. 3A1 to 3F1, respectively. Each of the cross-sectional views is taken along the line B-B in FIG. 3A1.

First, a film substrate 1 on which a plurality of wiring layers 2 are arranged in order as shown in FIG. 3A1 is provided. On an entire surface of the film substrate 1, a photoresist 4 is formed as shown in FIG. 3B1. Next, as shown in FIG. 3C1, an exposure mask 5 for forming bumps is placed above the photoresist 4 so as to oppose the photoresist 4. A light-transmitting region 5a of the exposure mask 5 has a continuous slit shape that extends across the plurality of wiring layers 2 in the direction along which the wiring layers 2 are arranged in order.

By exposing the photoresist 4 through the light-transmitting region 5a of the exposure mask 5 and then developing the photoresist 4, an opening as a slit-shaped pattern 4a extending across the plurality of wiring layers 2 is formed on the photoresist 4. As a result, the wiring layers 2 are partially exposed in the slit-shaped pattern 4a. Next, a metal is plated on the exposed portions of the wiring layers 2 through the slit-shaped pattern 4a to form bumps 3 as shown in FIG. 3E1. Then, by removing the photoresist 4, the tape carrier substrate 6 provided with the wiring layers 2 on which the bumps 3 are formed is obtained, as shown in FIG. 3F1.

As described above, by plating the metal on the exposed portions of the wiring layers 2 through the slit-shaped patterns 4a, the bumps 3 having the shape as shown in FIGS. 2A to 2C can be formed easily. In the process shown in FIG. 3E1, not only upper surfaces but also side surfaces of the wiring layers 2 are exposed and the exposed surfaces of the wiring layers 2 entirely are plated with a metal. This enables easy formation of the bumps 3.

It is not necessary that the slit-shaped pattern 4a of the photoresist 4 is formed so as to be a continuous pattern extending across the plurality of wiring layers 2 as shown in FIG. 3D1. That is, a pattern in which discrete openings respectively corresponding to the plurality of wiring layers 2 are formed may be used, as long as each of the openings includes at least predetermined regions on both sides of the corresponding wiring layer 2. However, the continuous slit-shaped pattern extending across the plurality of wiring layers 2 can be formed easily because the light-transmitting region 5a of the exposure mask 5 may have a continuous slit shape as shown in FIG. 3C1. As long as the slit-shaped pattern 4a extends over regions on both sides of the respective wiring layers 2, no problem occurs if the longitudinal direction of the slit-shaped pattern 4a makes some angle to the wiring layers 2. However, it is most reasonable that the longitudinal direction of the slit-shaped pattern 4a is orthogonal to the longitudinal direction of the wiring layers 2.

Moreover, the accuracy of the positioning of the bumps 3 relative to the wiring layers 2 can be ensured easily by forming the slit-shaped pattern 4a on the photoresist 4 and then plating a metal on the wiring layers 2. The reason for this is as follows. When the displacement of the slit-shaped pattern 4a relative to the wiring layers 2 is within an allowable range, each of the wiring layers 2 has intersection with the slit-shaped pattern 4a so as to be exposed therefrom. The metal coating formed by plating grows on the upper surface and side surfaces of each wiring layer 2. Thus, even if there is a displacement of the slit-shaped pattern 4a, the bumps 3 are formed into a constant shape and size, thereby allowing the bumps 3 satisfying the predetermined conditions to be obtained. Therefore, the position adjustment of the exposure mask 5 can be carried out easily because the strict positioning accuracy of the exposure mask 5 is not required.

In the case where the bumps 3 are formed using copper, the metal plating can be carried out as an electroplating using copper sulfate as a plating solution by applying a current of 0.3 to 5 A/dm$^2$. The electroplating is suitable for forming the bumps 3 so as to have a cross sectional shape as shown in FIG. 2C and a sufficient thickness.

Hereinafter, solution to various problems occurring due to the displacement of the exposure mask 5 in the method according to the present embodiment will be described. First, a positional relationship between electrode pads of a semiconductor chip and the wiring layers 2 of the tape carrier substrate 6 will be described with reference to FIG. 4 to FIG. 6.

Figure 4:
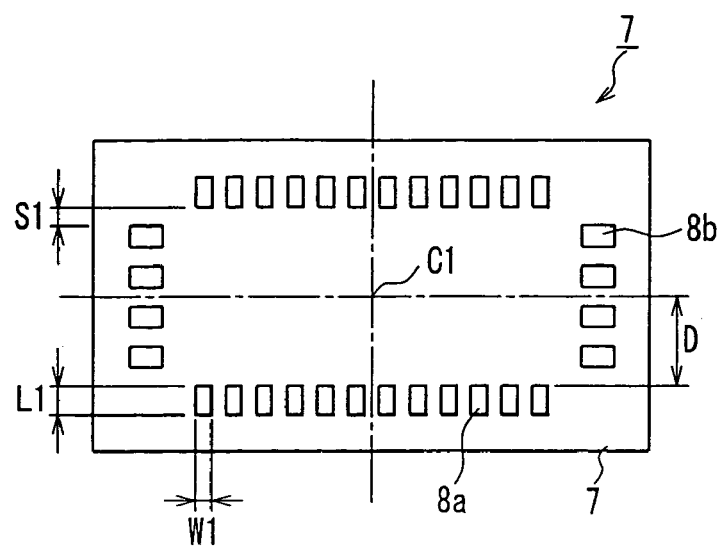
FIG. 4 is a plan view showing an example of a semiconductor chip.

FIG. 4 is a plan view showing an example of a semiconductor chip. FIG. 4 shows the arrangement of electrode pads formed on a surface of the semiconductor chip 7. The electrode pads arranged along the longer side direction of the semiconductor chip 7 bear reference numeral 8a, while the electrode pads arranged along the shorter side direction of the semiconductor chip 7 bear reference numeral 8b. There are more electrode pads 8a than the electrode pads 8b, and these electrode pads 8a are arranged more densely than the electrode pads 8b. C1 indicates the center of the semiconductor chip 7 (hereinafter referred to as "semiconductor chip center"). D is a distance between an inner edge line of the electrode pads and the semiconductor chip center C1. S1 is a distance between an inner edge line of the electrode pads 8a and an outer side edge of the electrode pad 8b arranged closest to the electrode pads 8a. L1 is a length of the electrode pads 8a, and W1 is a width of the electrode pads 8a.

Figure 5:
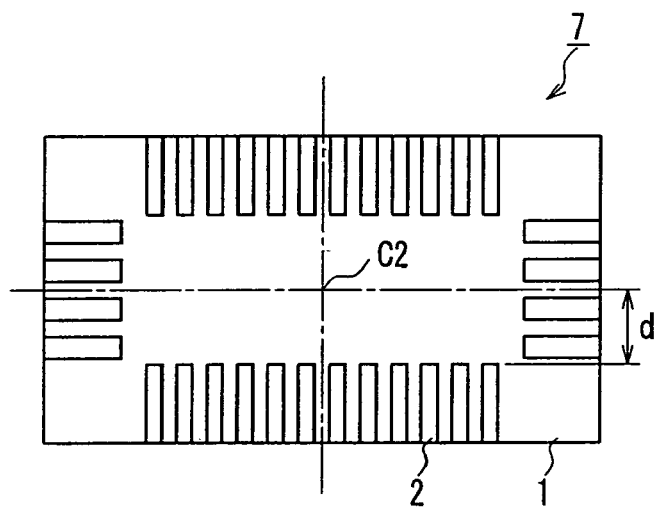
FIG. 5 is a plan view showing a film substrate on which wiring layers are formed, which is used for manufacturing a tape carrier substrate.

FIG. 5 is a plan view showing a part of a film substrate 1 on which wiring layers 2 are formed, which is used for manufacturing the tape carrier substrate. C2 indicates the center of a region for mounting the semiconductor chip 7 (hereinafter referred to as "semiconductor chip-mounting-region center"). d is a distance between an inner edge line of the wiring layers 2 arranged along the longer side of the film substrate 1 and the semiconductor chip-mounting-region center C2.

Figure 6:
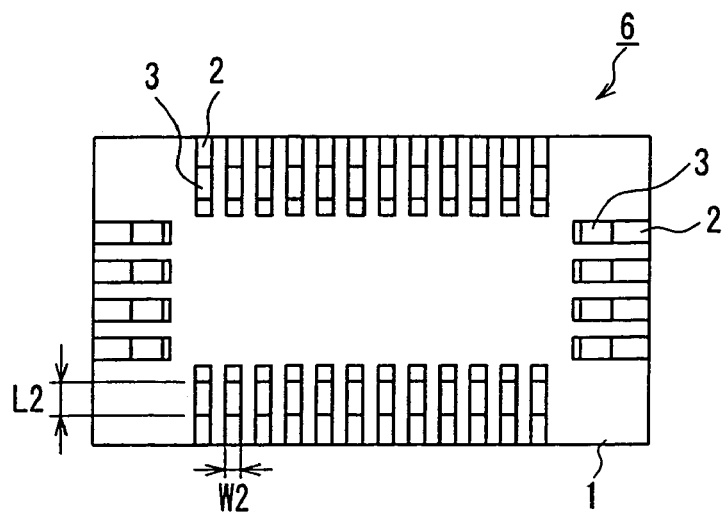
FIG. 6 is a plan view showing a region for mounting a semiconductor chip in one example of a tape carrier substrate manufactured by the method according to Embodiment 2.

FIG. 6 is a plan view showing a part of a region for mounting a semiconductor chip in the tape carrier substrate 6 provided with the wiring layers 2 on which the bumps 3 are formed according to the method according to the present embodiment. FIG. 6 shows the bumps 3 obtained in the state where there is no displacement of the exposure mask 5 in FIG. 3C1 relative to the wiring layers 2. L2 is a length of the bumps 3, and W2 is a width of the bumps 3.

Considering a displacement of the exposure mask 5 in the longitudinal direction of the wiring layers 2, it is preferable that the distance d between the semiconductor chip-mounting-region center C2 and the wiring layers 2 is shorter than the distance D between the semiconductor chip center C1 and the electrode pads 8a. Also, it is preferable that the length L2 of the bumps 3 is longer than the length L1 of the electrode pads 8a. According to this configuration, even if the displacement of the exposure mask 5 results in the displacement of the formed bumps 3 in the longitudinal direction of the wiring layers 2, the portion where each of the bumps 3 opposes the corresponding electrode pad 8a still can have a sufficient area.

Figure 7:
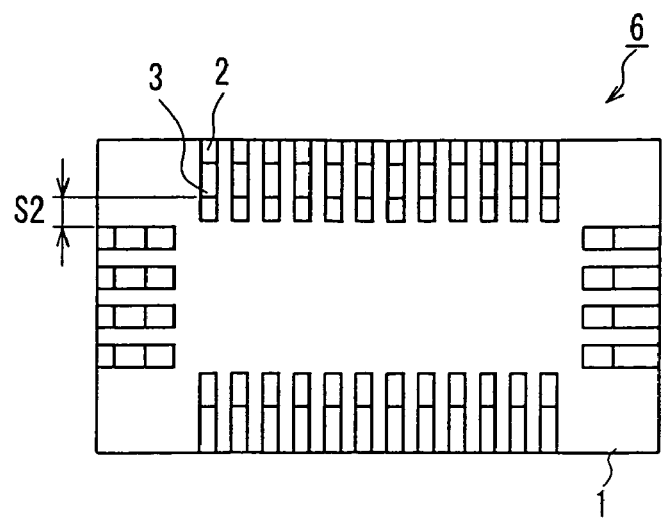
FIG. 7 is a plan view showing a region for mounting a semiconductor chip in another example of a tape carrier substrate manufactured by the method according to Embodiment 2.

Similarly to FIG. 6, FIG. 7 is a plan view showing a part of a region for mounting a semiconductor chip in the tape carrier substrate 6 provided with the wiring layers 2 on which the bumps 3 are formed according to the method according to the present embodiment. FIG. 7 shows the bumps 3 obtained in the state where the exposure mask 5 in FIG. 3C1 is displaced relative to the wiring layers 2 in the short-side direction of the film substrate 1. S2 is a space between an inner edge line of the bumps 3 formed on the wiring layers 2 arranged along the longer side direction of the film substrate 1 and an outer side edge of the bump 3 on the wiring layer 2 that is arranged along the shorter side of the film substrate 1 and closest to the longer side of the film substrate 1.

In the state shown in FIG. 7, although the bumps 3 satisfy all the designed sizes, the space S2 differs in size from the space S1 shown in FIG. 4 owing to the displacement of the exposure mask 5 relative to the wiring layers 2. That is, when the exposure mask 5 is displaced in the short-side direction of the film substrate 1, the positions of the bumps 3 move in the longitudinal direction of the wiring layers 2 on the wiring layers 2 arranged along the longer side of the film substrate 1, whereas the positions of the bumps 3 do not move on the wiring layers 2 arranged along the shorter side of the film substrate 1. Solution to this problem is shown in FIGS. 8 and 9.

Figure 8:
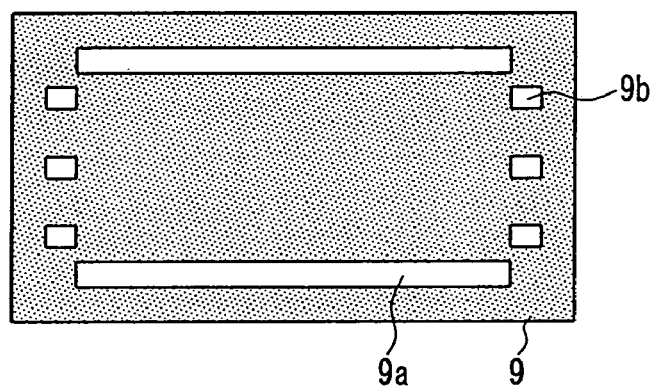
FIG. 8 is a plan view showing one example of an exposure mask according to Embodiment 2.
Figure 9:
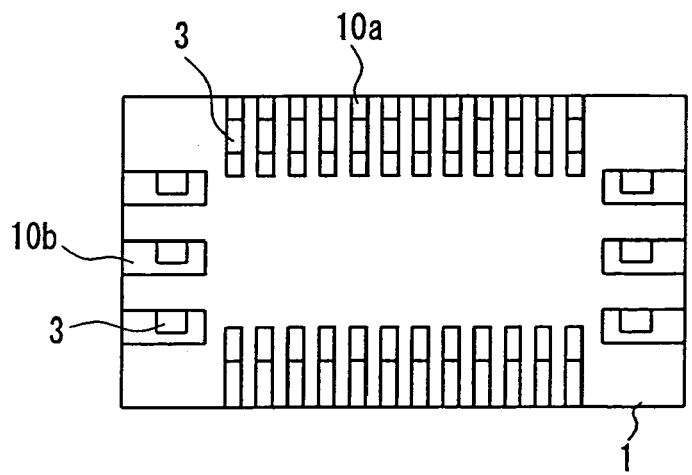
FIG. 9 is a plan view showing a tape carrier substrate on which wiring layers according to a modified example of Embodiment 2 are formed.

FIG. 8 shows an exposure mask 9 having a different mask pattern from the exposure mask 5 used in the process shown in FIG. 3C1. In this exposure mask 9, light-transmitting regions 9a provided in portions corresponding to the portions along the longer sides of a film substrate are formed as continuous openings, while light-transmitting regions 9b provided in portions corresponding to the portions along the shorter sides of a film substrate are formed as discrete openings. When using this exposure mask 9, a film substrate 1 having wiring layers 10a and 10b formed as shown in FIG. 9 is used. In this film substrate 1, the wiring layers 10b arranged along the shorter side are wider than the wiring layers 10a arranged along the longer side.

By forming opening patterns on a photoresist using the above-described exposure mask 9 and then plating a metal on the wiring layers 10a and 10b through the opening patterns, the bumps 3 with the designed size can be obtained and the space S2 shown in FIG. 7 can be made equal in size to the space S1 shown in FIG. 4. That is, when the exposure mask 9 shown in FIG. 8 is displaced in the short-side direction of the film substrate 1, then, on the wiring layers 10b arranged along the shorter side of the film substrate 1, the light-transmitting regions 9b of the exposure mask 9 move in the width direction so that the positions of the formed bumps 3 move as shown in FIG. 9. However, since the wiring layers 10b are wide, the bumps 3 having the predetermined size can be formed as long as the amount of the movement is within an allowable range. The amount in which the positions of the formed bumps 3 move on the wiring layers 10b is equal to the amount in which the positions of the bumps 3 move in the longitudinal direction of the wiring layers 10a on the wiring layers 10a arranged along the longer side of the film substrate 1. As a result, the space S2 can be made equal in size to the space S1.

FIGS. 10A and 10B show processes corresponding to those shown in FIG. 3C1, which are carried out using an exposure mask 11 having anther configuration. The exposure mask 11 is configured so that a light-shielding region 11a is formed at a portion corresponding to the light-transmitting region 5a of the exposure mask 5 shown in FIG. 3C1. This exposure mask 11 can be used when the photoresist 4 is a negative photoresist. Other conditions for this exposure mask 11 are the same as those for the exposure mask 5 shown in FIG. 3C.

Embodiment 3

The configuration of a tape carrier substrate according to Embodiment 3 and a method for manufacturing the same will be described with reference to FIG. 11. In the present embodiment, each wiring layer 12 formed on a film substrate 1 is formed so that a leading end portion 12a is narrower than a base portion 12b. The reason for this is as follows.

During the formation of the bumps 3 by the electroplating as shown in FIG. 3E1, a copper layer formed by the electroplating also grows in the width direction of each wiring layer 2. Thus, short circuits may occur between copper layers growing from adjacent wiring layers 2 in the width direction. However, the attempt to expand the space between the adjacent wiring layers 2 to avoid the occurrence of such short circuits results in the decrease in the packaging density of the wiring layers 2, which renders the downsizing of a semiconductor device difficult.

On this account, by forming the leading end portion 12a of each of the wiring layers 2 so as to be narrower than the base portion 12b with the bumps 3 formed on the narrow leading end portions as in the present embodiment, it becomes possible to reduce the risk that short circuits might occur between copper layers growing from adjacent wiring layers 12 in the width direction.

Embodiment 4

A semiconductor device according to Embodiment 4 and a method for manufacturing the same will be described with reference to FIG. 12. In a tape carrier substrate 6, bumps 3 are formed on a plurality of wiring layers 2 arranged on a film substrate 1, and the bumps 3 have a shape as shown in FIGS. 2A to 2C, as in the above-described embodiments. That is, each of the bumps 3 is provided across the corresponding wiring layer 2 so as to extend over regions on both sides of the wiring layer 2, and the cross sectional shape of the bump 3 taken in the width direction of the wiring layer 2 is such that the bump 3 is joined to an upper surface and both side surfaces of the wiring layer 2. Furthermore, the cross sectional shape of the bump 3 taken in the width direction of the wiring layer 2 is such that a central portion is higher than portions on both sides of the central portion. In a semiconductor chip 21 mounted on the tape carrier substrate 6, electrode pads 27 of the semiconductor chip 21 are connected to the bumps 3, and the space between the tape carrier substrate 6 and the semiconductor chip 21 are filled with an encapsulation resin 22.

A semiconductor device of the present embodiment is manufactured by placing the semiconductor chip 21 on the tape carrier substrate 6 manufactured by the method according to the above-described embodiments and then pressing the semiconductor chip 21 with a bonding tool 13. Preferably, ultrasonic energy is applied to the semiconductor chip 21 via the bonding tool 13. This allow a head having a protruding central portion of each bump 3 to vibrate in the state where the head is in contact with an oxide film on a surface of the corresponding electrode pad 27, thereby enhancing the effect of breaking the oxide film.

Figure 13A:
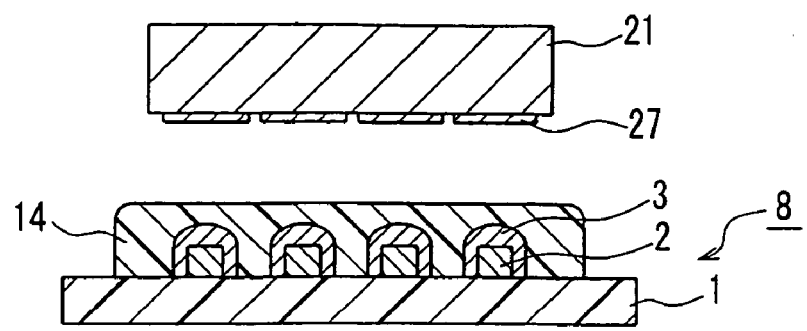
FIGS. 13A and 13B are cross-sectional views illustrating another example of a method for manufacturing a semiconductor device, according to Embodiment 4.
Figure 13B:
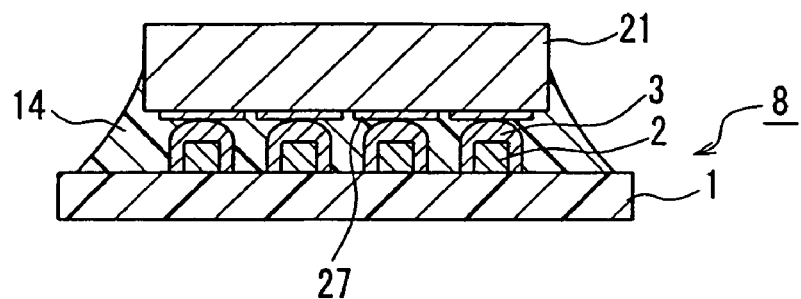
Figure 14:
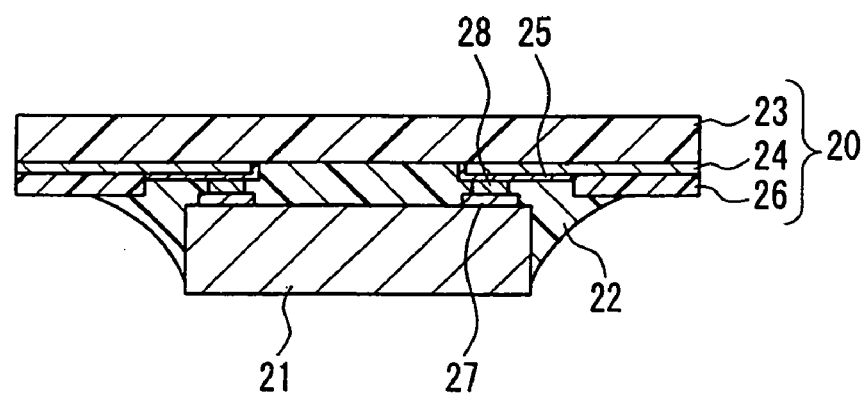
FIG. 14 is a cross-sectional view showing a part of a conventional COF package module.
Figure 16A:
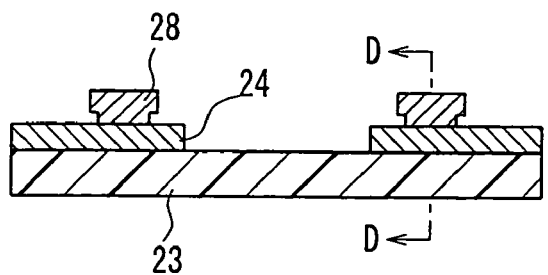
FIGS. 16A and 16B are cross-sectional views showing a part of a tape carrier substrate manufactured by the processes shown in FIGS. 15A1 to 15F1 and FIGS. 15A2 to 15F2.
Figure 16B:
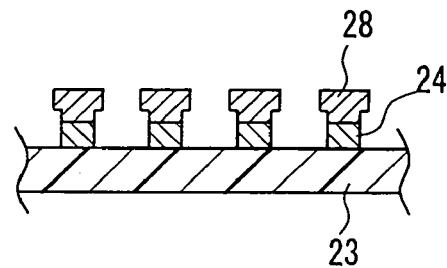
Figure 17:
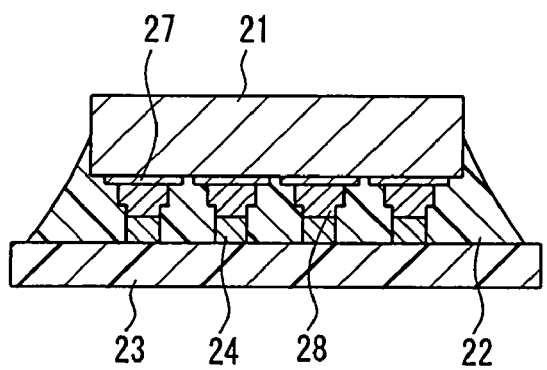
FIG. 17 is a cross-sectional view showing the state where a semiconductor chip is mounted on the tape carrier substrate shown in FIGS. 16A and 16B.
Figure 18:
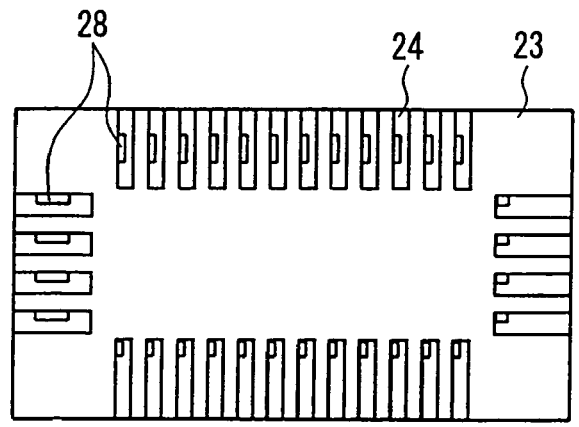
FIG. 18 is a plan view showing a part of a tape carrier substrate to explain a problem in the processes illustrated in FIGS. 15A1 to 15F1 and FIGS. 15A2 to 15F2.

Also, it is possible to mount the tape carrier substrate 6 on the semiconductor chip 21 by the method shown in FIGS. 13A and 13B. More specifically, a region of the tape carrier substrate 6 where the bumps 3 are formed is provided with an encapsulation resin 14, as shown in FIG. 13A. Subsequently, the semiconductor chip 21 is placed so as to oppose the tape carrier substrate 6 and then, the semiconductor chip 21 and the tape carrier substrate 6 are pressed against each other so that the bumps 3 are in contact with the electrode pads 27, respectively, as shown in FIG. 13B. During the process shown in FIG. 13B, the upper surfaces with a protruding central portion of the bumps 3 effectively displace the encapsulation resin 14 to both sides, thereby allowing the bumps 3 to be brought into contact with the electrode pads 27 easily.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for manufacturing a semiconductor device, comprising:
   mounting a semiconductor chip on a circuit board having an insulating substrate, a plurality of wiring layers arranged on the insulating substrate, and bumps formed on the wiring layers respectively, in which the bump is provided across a longitudinal direction of a corresponding one of the wiring layers so as to extend over regions on both sides of the wiring layer in a direction perpendicular to the longitudinal direction of the wiring layer and contact a surface of the insulating substrate, without a stepped portion formed on a surface of the bump, and a cross sectional shape of the bump taken in a width direction of the wiring layer is such that a central portion is higher than both side portions; and
   connecting electrode pads of the semiconductor chip to the bumps, thereby achieving connection between the electrode pads of the semiconductor chip and the wiring layers via the bumps.

2. The method according to claim 1, wherein when connecting the bump to the electrode pad, an oxide film formed on the electrode pad of the semiconductor chip is broken with the bump, thereby achieving electrical connection between the bump and the electrode pad.

3. The method according to claim 1, wherein before performing the step of mounting the semiconductor chip on the circuit board and the step of connecting the electrode pads of the semiconductor chip to the bumps, a region of the wiring layers on which the bumps are formed is provided with an encapsulation resin.

4. The method according to claim 1, wherein when the electrode pads of the semiconductor chip are connected to the bumps, ultrasonic energy is applied to portions where the electrode pads are in contact with the bumps while pressing the electrode pads and the bumps against each other.

5. The method according to claim 1, wherein a cross sectional shape of the bump taken in a longitudinal direction of the wiring layer is substantially rectangular.

6. The method according to claim 1, wherein the wiring layers and the bumps are plated with a metal that is different from materials of the wiring layers and the bumps.

7. The method according to claim 1, wherein each of the wiring layers has a narrow region, and the bump is formed in the narrow region.

8. The method for manufacturing a semiconductor device according to claim 1, wherein at least a part of the central portion of the upper surface of the bump is flat.

9. The method according to claim 8, wherein when connecting the bump to the electrode pad, an oxide film formed on the electrode pad of the semiconductor chip is broken with the bump, thereby achieving electrical connection between the bump and the electrode pad.

10. The method according to claim 8, wherein before performing the step of mounting the semiconductor chip on the circuit board and the step of connecting the electrode pads of the semiconductor chip to the bumps, a region of the wiring layers on which the bumps are formed is provided with an encapsulation resin.

11. The method according to claim 8, wherein when the electrode pads of the semiconductor chip are connected to the bumps, ultrasonic energy is applied to portions where the electrode pads are in contact with the bumps while pressing the electrode pads and the bumps against each other.

12. The method according to claim 8, wherein a cross sectional shape of the bump taken in a longitudinal direction of the wiring layer is substantially rectangular.

13. The method according to claim 8, wherein the wiring layers and the bumps are plated with a metal that is different from materials of the wiring layers and the bumps.

14. The method according to claim 8, wherein each of the wiring layers has a narrow region, and the bump is formed in the narrow region.

* * * * *